SEMICONDUCTOR DEVICES INCLUDING LEAD AND PLASTIC HOUSING STRUCTURE SUITABLE FOR AUTOMATED PROCESS CONSTRUCTION

Original Filed June 18, 1965

(Actual Size)

INVENTORS
Robert W. Helda
Milan L. Lincoln

BY

Mueller, Aichele & Rauner
ATT'YS.

United States Patent Office 3,444,441

Patented May 13, 1969

3,444,441

SEMICONDUCTOR DEVICES INCLUDING LEAD AND PLASTIC HOUSING STRUCTURE SUITABLE FOR AUTOMATED PROCESS CONSTRUCTION

Robert W. Helda and Milan L. Lincoln, Scottsdale, Ariz., assignors to Motorola, Inc., Franklin Park, Ill., a corporation of Illinois Original application June 18, 1965, Ser. No. 465,123. Divided and this application Oct. 6, 1967, Ser. No. 673,464

Int. Cl. H01l 5/02, 11/02

U.S. Cl. 317—234 4 Claims

ABSTRACT OF THE DISCLOSURE

A plastic encapsulated semiconductor device is mass produced by a series of steps involving the use of a multiple-unit lead frame in the form of an elongated, rectangular metallic strip having a particular geometric configuration. The lead frame strip includes a continuous lead mounting portion which extends the length of the strip, and a plurality of leads integral with the mounting portion extending at right angles therefrom. The leads are arranged in spaced parallel groups joined by a continuous tie band extending parallel to the lead mounting portion, intermediate the lead mounting portion and the lead ends. At least one lead of each group includes an end portion adapted for the bonding of a semiconductor element thereto, while the ends of the other leads of each group are adapted for wire bonding to form electrical connections with the semiconductor element. The method includes the steps of die-bonding and wire bonding to complete the electrical structure, followed by the step of encapsulating the semiconductor elements and the adjacent lead portions in plastic, and then severing the mounting portion and tie band from the metallic strip, whereupon the completed assembly is ready for testing and separation of the individual units.

This application is a division of U.S. Ser. No. 465,123 filed June 18, 1965.

*Background*

This invention relates to semiconductor devices, and more particularly, to a device which will lend itself to indexed continuous automatic assembly and to encapsulation in multiple units, and to a method for assembling such a device.

The active element of a semiconductor device, or die, as it is called, is of very minute size. This element, when it becomes part of a semiconductor device, must be mounted so as to obtain good ohmic contact between the element and the mounting area and yet be protected from contaminating material. The present practice is to mount the element on a header from which the external leads extend. After making electrical connections to the element, the device is enclosed in a suitable protecting medium, usually a metal can, which is hermetically sealed to the header. This construction requires many hand operations during the device assembly. Also, the header must be preassembled prior to the device assembly. Thus, a sizeable portion of the cost of the device is represented in relatively expensive parts and labor costs represented in the assembly and packaging process which includes the handling of many individual parts.

Even though improvements have been made in the individual assembly of semiconductor devices and the costs vary for the different devices and assembly of each, it has not been possible to produce these devices in truly highly automated fashion.

*The invention*

It is an object of this invention to provide a semiconductor device and a method of assembling or fabricating the same, wherein the main portions thereof can be formed in a continuous punch press-like operation, and all of the elements can be assembled, and then encapsulated in large numbers and by automatic means to provide uniformity in the devices and low cost of manufacture.

In short, it is an object of this invention to provide structure and parts for semiconductor devices which make the device assembly more susceptible to automation in order to reduce the cost of manufacture of the device.

A further object of this invention is to provide a metal structure which aids in the assembly of semiconductor devices, and facilitates the use of high speed plastic molding techniques for encapsulating in multiples.

A still further object of this invention is to minimize in a semiconductor device the number of individual parts required for each device to reduce the cost of parts and assembly.

A feature of the invention is the provision of a punched metallic strip which has an array of individual leads and a semiconductor element mount formed in the punching operation, which remain integral at one end to continuous portions of the strip so as to facilitate handling during assembly of semiconductor devices and substantially self-jig the devices in the assembly operation.

A further feature of the invention is the provision of such a punched strip, wherein the external leads are provided in groups corresponding in number to the number of external leads ultimately required, with one lead serving as a mounting for the semiconductor element and a connection therefrom, and with adjacent leads in a group connected with the semiconductor element by wires.

Another feature of the invention is the provision of a single continuous punched strip which provides the greater part of the ultimate devices and is of a structure which facilitates original precision punching, and ultimate machine assembly of the few remaining parts as well as encapsulation.

Another feature of the invention is the provision of a mechanical structure which lends itself to high speed plastic encapsulation of the semiconductor element.

A still further feature of this invention is the provision of leads which are useful during assembly and ultimately are of a cross-sectional configuration such that each lead may be readily plugged into a socket, or soldered into an electrical circuit.

*The drawings*

A semiconductor device assembled in accordance with this invention has the semiconductor element thereof mounted directly on a portion of an external lead, which is one of a plurality of leads formed by punching a continuous one-piece metallic strip into a predetermined configuration. The strip provides the structure for many devices which can be separated at the conclusion of manufacture. The leads are held together in a precise orientation by a lead mounting portion and a tie strip which are integral with the leads. For a three electrode semiconductor device, as a transistor, the leads are provided in groups of three with each group spaced away from but connected with each adjacent group. The semiconductor element for each device made out of each group is mounted on one of the external leads in a position such that the electrodes thereof can be connected to other external leads in the group by short lengths of fine wires. The exposed semiconductor element and wires for each device made out of a group are then placed in separate cavities of a multiple cavity mold and the devices are encapsulated in a plastic material. More than fifty (50) groups have been held together during the assembly by means of the continuous tie strip and lead mounting portion. The plurality of devices thus held together are transferred to a clipper-tester which clips the connecting band and tie strip while holding the devices in a specific orientation for testing, and provides the plurality of individual units. The devices are then tested on automatic testing equipment which also segregates the devices in accordance with the appropriate test values.

Figure 1:
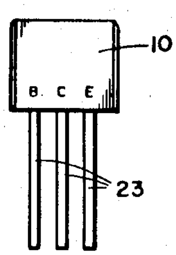
FIG. 1 is an enlarged front view of a transistor embodying the present invention.
Figure 2:
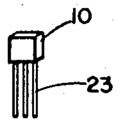
FIG. 2 is a perspective view of the transistor illustrated in FIG. 1 showing the actual size of the unit.

FIG. 1 shows a completed transistor which has been assembled in accordance with the present invention. The finished transistor consists of a plastic encapsulation 10 and the external leads 23. FIG. 2 is the actual size of a transistor assembled in accordance with this invention.

Figure 3:
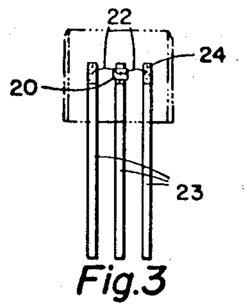
FIG. 3 is an enlarged transparent view of the assembled transistor showing the relative positions of the element, fine wires and external leads.

In the transparent view, FIG. 3, the relative positions of the external leads 23 and the active semiconductor element 20 may be seen. The active element 20 has been mounted on an external lead 23 at one end thereof, as will be described, and the fine wires 22, approximately 0.001 inch in diameter, have been connected to the adjacent external leads 23. The element 20 and the other external leads are positioned so that the fine wire 22 in very short lengths can be used to connect the parts together.

Figures 4A, 4B, 4C:
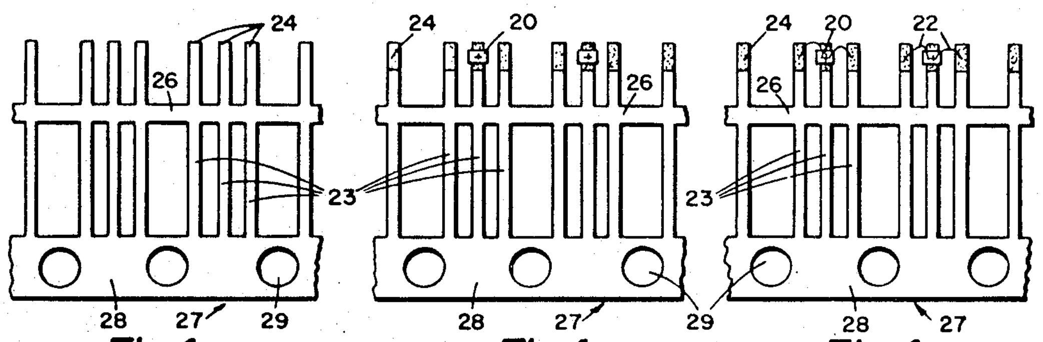
FIG. 4A is an enlarged view of a punched metallic strip showing mounting pads, external leads, tie strip and lead mounting portion.
FIG. 4B is an enlarged view of a punched metallic strip showing mounted elements and gold plated mounting pads.
FIG. 4C is an enlarged view of a punched metallic strip showing mounted elements connected to external leads by fine wires.
Figures 5A, 5B:
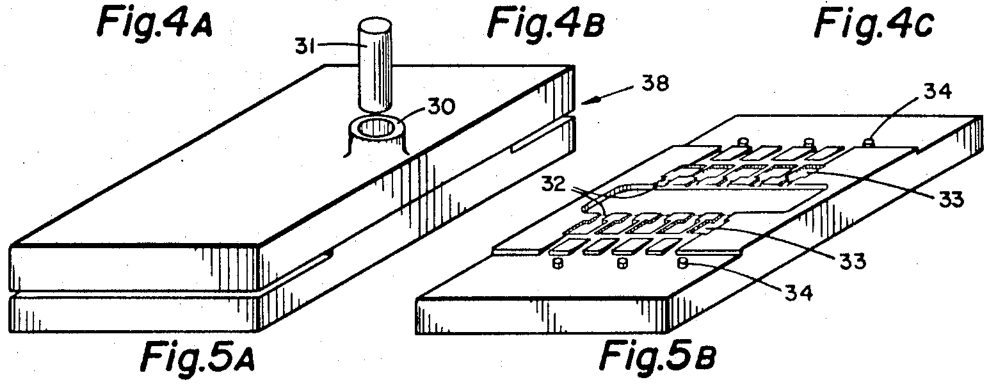
FIG. 5A is a perspective view of a transfer mold used for encapsulation of the devices.
FIG. 5B is a perspective view showing the bottom die of the transfer mold illustrated in FIG. 5A.

FIG. 4A illustrates a punched metallic strip which incluldes mounting pads 24, a tie strip 26, and a lead mounting portion 28. The strip in its entirety has been made up with fifty (50) or more groups of leads, and the mounting pad 24 for the element 20 in each group is at an end of a lead, and is spaced laterally from each adjacent lead. There is a mounting pad 24 on an end portion of each lead to accommodate a wire or element as shown in FIG. 4C.

In the embodiment of the invention illustrated, each mounting pad is spaced on the order of 0.05 inch from an adjacent end portion of a lead in the same group. The tie strip 26 maintains the precise location of each mounting pad and acts as a closing point for the mold 38 during the encapsulation process. The lead mounting portion 28 has indexing holes 29 which are used in the automatic bonding of the element to a pad 24, for wire bonding and for encapsulation of the device. The lead mounting portion 28 in conjunction with the tie strip 26 holds the plurality of devices together during the various assembly steps.

In FIG. 4B a transistor element 20 is mounted on a mounting pad 24 which is part of an external lead 23. This mounting pad 24 has been gold plated so that the element may be bonded directly thereto. The metallic strip 27 is placed in an automatic feed mechanism which, by means of the indexing holes 29, positions the mounting pads 24 for each transistor under the element bonding equipment in a predetermined attitude and orientation. This precise method allows the transistor element 20 to be mounted automatically on the mounting pad 24.

Fine wires 22 are used to connect the electrodes of the transistor elements 20 to the gold plated mounting pads 24 on the other external leads 23 comprising the transistor device. The metallic strip 27 with the transistor elements 20 on selected mounting pads is placed in an automatic feeding mechanism which, by means of the indexing holes 29, positions the mounting pads 24 of each transistor under the wire bonding equipment in a predetermined orientation and attitude. This precise method reduces the wire bonding time by reducing the number of operator manipulations required.

The connected assembled devices, each consisting of an active element 20, fine connecting wires 22, and external lead 23, are placed in a multiple cavity mold 38. Each cavity 33 accommodates one assembly which will ultimately be cut off to serve as a single device. Locating pins 34 extending upwardly from the bottom portion of the mold 38 engage the indexing holes 29 in the connecting band 28 to facilitate alignment of the assemblies in the mold 38. The mold closes on the tie strip 26, thereby avoiding the necessity of the mold mating in the areas between the external leads 23.

Figure 6A:
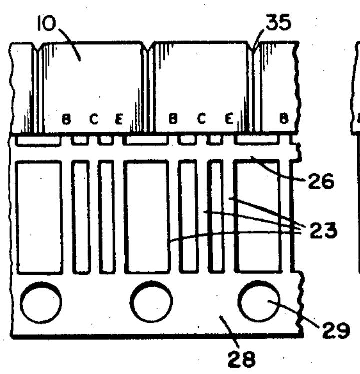
FIG. 6A is a front view of the encapsulated devices joined by the lead mounting portion and the tie strip shown in FIG. 4A–4C.

A thermosetting epoxy plastic material is forced into the mold through the cylindrical passage 30 and the combination of the pressure from the piston 31 and the mold temperature results in the epoxy material entering the cavities 33 through the gates 32 at the lowest viscosity of the epoxy. Because of this low viscosity, the shortness of the fine wires and the position of the gates, the fine wires are not broken during this encapsulation process. In a very short time the epoxy material cures and the finishing molding, FIG. 6A, is removed. The encapsulated devices are joined by the lead mounting portion 28, the tie strip 26 and the plastic encapsulation 10 which has a break point 35 provided to facilitate the separation of the devices after electrical testing.

Figure 6B:
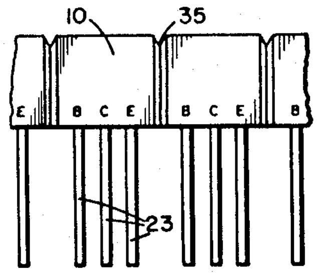
FIG. 6B is a front view of the encapsulated devices after the lead mounting portion and the tie strip have been clipped.
Figure 6C:
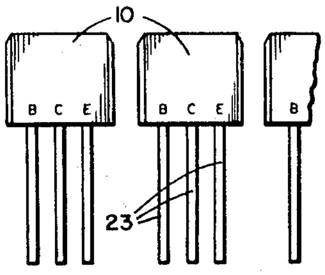
FIG. 6C is a front view of the devices after separation and testing.

FIG. 6B shows the devices after being sent to a clipper-tester which removes the lead mounting portion 28 and the tie strip 26, shown in FIG. 6A, leaving the units connected by the plastic encapsulation 10 so that a specific orientation of the plurality of devices may be obtained automatically when the devices are tested on a testing machine. After testing, the devices (FIG. 6C) are separated along the break points 35 (FIG. 6B) and are segregated according to the appropriate test values.

A mounting strip fabricated as herein disclosed greatly improves the assembling and encapsulation of a semiconductor device by permitting the automation of the mounting of the element, wire bonding and encapsulation of said device. By changing the number of external leads and the location of the mounting areas, more complex devices may be assembled in accordance with this invention.

We claim:

1. In a semiconductor device having a molded unitary plastic housing, the combination of a plurality of metal parts each having a portion thereof within said plastic housing and a portion thereof extending outside said plastic housing, a semiconductor unit secured to one metal part within said plastic housing and conductively connected within said housing with each of said other metal parts, with said portions of said metal parts extending out of said plastic housing to serve as connectors for the semiconductor device, and with said metal part portions extending outside said plastic housing being joined by severable tie strip means integral therewith at a point between the plastic housing and the end of each said portion extending outside said plastic housing and retaining said extending portions parallel with one another during molding and serving as a plastic mold closing point in such molding, said tie strip means being retained with the device until after the molding and then being severed from said metal part portions to leave each of said extending portions free relative to one another to act as connectors for the device.

2. In a device as defined in claim 1 wherein the portions of the metal parts within the plastic housing are directly in contact with the plastic material and are housed thereby.

3. In a device as defined in claim 1 wherein the metal parts are originally in a multiple part one-piece flat structure adapted for automated process construction, and wherein the plastic housed devices are separated after plastic encapsulation.

4. In a device as defined in claim 3, wherein the original multiple part one-piece flat structure includes a mounting portion extending longitudinally of said structure, spaced from and parallel with said tie strip means and integral with said metal part portions extending outside of said plastic housing, said mounting portion being severable from said metal part portions extending outside of said plastic housing.

References Cited

UNITED STATES PATENTS

| | | | |
|---|---|---|---|
| 3,030,562 | 4/1962 | Maiden et al. | 317—235 |
| 3,212,160 | 10/1965 | Dale et al. | 29—25.3 |
| 3,231,797 | 1/1966 | Koch | 317—235 |
| 3,235,937 | 2/1966 | Lanzl et al. | 29—25.3 |
| 3,243,670 | 3/1966 | Dunster et al. | 317—234 |
| 3,244,939 | 4/1966 | Sandbank | 317—101 |
| 3,262,022 | 7/1966 | Caracciolo | 317—101 |
| 3,317,287 | 5/1967 | Caracciolo | 29—193 |

JOHN W. HUCKERT, *Primary Examiner.*

R. SANDLER, *Assistant Examiner.*

U.S. Cl. X.R.

29—588, 591; 174—52; 317—235